(12) United States Patent
Yu et al.

(10) Patent No.: US 6,350,660 B1
(45) Date of Patent: Feb. 26, 2002

(54) PROCESS FOR FORMING A SHALLOW TRENCH ISOLATION

(75) Inventors: Shiuh-Sheng Yu, Chi-Lung; Chun-Hung Lee, Tao-Yuan; Ming-Chung Liang, Taipei, all of (TW)

(73) Assignee: Macronix International Co., Ltd. (TW)

(*) Notice: Subject to any disclaimer, the term of this patent is extended or adjusted under 35 U.S.C. 154(b) by 0 days.

(21) Appl. No.: 09/840,896

(22) Filed: Apr. 25, 2001

(51) Int. Cl.[7] ............................................. H01L 21/76
(52) U.S. Cl. ...................... 438/424; 438/221; 438/296; 257/510
(58) Field of Search ................................. 438/296, 221, 438/424, 689, 713; 257/510

(56) References Cited

U.S. PATENT DOCUMENTS

| | | | |
|---|---|---|---|
| 4,495,025 A | * | 1/1985 | Haskell ........................ 438/424 |
| 5,256,591 A | * | 10/1993 | Jun ............................ 438/424 |
| 5,677,232 A | * | 10/1997 | Kim et al. ................... 438/424 |
| 5,731,221 A | * | 3/1998 | Kwon ......................... 438/424 |
| 5,753,561 A | * | 5/1998 | Lee et al. .................... 438/424 |
| 5,910,018 A | * | 6/1999 | Jang .......................... 438/425 |
| 6,020,230 A | * | 2/2000 | Wu ............................ 438/222 |
| 6,054,343 A | * | 4/2000 | Ashburn ..................... 438/221 |
| 6,107,158 A | * | 8/2000 | Zheng et al. ................ 438/424 |
| 6,130,467 A | * | 10/2000 | Bandyopadhyay et al. . 257/506 |
| 6,204,131 B1 | * | 3/2001 | Shin .......................... 438/294 |
| 6,207,532 B1 | * | 3/2001 | Lin et al. .................... 438/424 |
| 6,238,996 B1 | * | 5/2001 | Liu et al. .................... 438/400 |
| 6,274,457 B1 | * | 8/2001 | Sakai et al. ................. 438/424 |
| 6,281,093 B1 | * | 8/2001 | Pradeep et al. ............. 438/424 |

* cited by examiner

*Primary Examiner*—Charles Bowers
*Assistant Examiner*—David S. Blum

(57) ABSTRACT

First of all, a semiconductor substrate that has a pad oxide layer thereon is provided. Then a nitride layer is formed on the pad oxide layer. Next, a photoresist layer is formed and defined on the nitride layer. Afterward, performing a residual etching process to etch the nitride layer to form an opening and a convex remainder of the nitride layer. The convex remainder of the nitride layer and the semiconductor substrate are then etched by way of using a top rounding process to form the rounding corners on the semiconductor substrate. Subsequently, performing a process for forming the trench to form a trench with the rounding corners. Finally, the follow-up processes are performed to form the shallow trench isolation.

32 Claims, 8 Drawing Sheets

PROCESS FOR FORMING A SHALLOW TRENCH ISOLATION

BACKGROUND OF THE INVENTION

1. Field of the Invention

The present invention relates generally to a method for forming a Shallow Trench Isolation (STI), and more particularly to a process for forming a Shallow Trench Isolation (STI) with etching the silicon nitride.

2. Description of the Prior Art

As semiconductor devices, such as Metal-Oxide-Semiconductor devices, become highly integrated the area occupied by the device shrinks, as well as the design rule. With advances in the semiconductor technology, the dimensions of the integrated circuit (IC) devices have shrunk to the deep sub-micron range. When the semiconductor device continuously shrinks to the deep sub-micron region, some problems described below are incurred due to the process of scaling down.

Shallow trench isolation (STI) is one of the isolation technologies applied to the fabrication of semiconductor devices. Cross-sectional views of a process for forming a salicide protected circuit of the known prior art are illustrated in FIG. 1A to FIG. 1D. First of all, a semiconductor substrate 100 is provided. Next, a pad oxide layer 110 is formed on the semiconductor substrate 100, and then a nitride layer 120 is formed on the pad oxide layer 110. Performing a photolithography process and an anisotropic etching process to form a trench 130 from the nitride layer 120 through the pad oxide 110 into the substrate 100. Afterward, a liner oxide 140 is deposited on surfaces of the nitride layer 120 and the trench 130 mentioned above. An oxide layer 150 serving as the isolation layer is subsequently deposited on the liner oxide 140 and polished by a Chemical Mechanical Polishing( CMP )process. The Chemical Mechanical Polishing (CMP) process removes the oxide layer 150 and the liner oxide 140 till the nitride layer 120 is exposed. Finally, removing the nitride layer 120, the liner oxide 140 and the isolation layer 150 until the surface of the pad oxide layer 110 on the semiconductor substrate 100.

The evolution of integrated circuits has evolved such that scaling down the device geometry is necessary. In the deep sub-micron technology of semiconductors, it's necessary that the dimension of the device be decreased to reduce the space where the devices occupy. Therefore, a shallow trench isolation devices having a small size is formed by way of etching the nitride layer, so as to reduce the space that is occupied with the devices. Unfortunately, the conventional process for etching the nitride layer 120 will result in the corner-tipped 160 in the structure of the trench 130, so that the shallow trench isolation produces the high electric field and the pre-breakdown or the discharge-tipped effect when the dimension of the devices is scaled down, as shown in FIG. 1E.

Furthermore, if the structure of the shallow trench isolation is formed without the corner-tipped, a thermal process having a high temperature with a long processing time is performed after the conventional process for etching the nitride layer, so as to round off the corner-tipped. Therefore, the conventional process is very difficult to perform in below deep sub-micron. Especially, the method for forming the shallow trench isolation becomes more complex, a waste time, hence, an increase in cost.

In accordance with the above description, a new and improved method for forming the shallow trench isolation is therefore necessary, so as to raise the yield and quality of the follow-up process.

SUMMARY OF THE INVENTION

In accordance with the present invention, a method is provided for fabricating the shallow trench isolation that substantially overcomes the drawbacks of the above mentioned problems that arise from conventional methods.

Accordingly, it is a main object of the present invention to provide a method for fabricating the shallow trench isolation. This invention can use a residual etching process with a top rounding process to form the shallow trench isolation having better rounded corners. This will avoid the formation of the corner-tipped on the top of the trench structure that results in the high electric field and the pre-breakdown or the discharge-tipped effect when the dimension of the devices is scaled down. Hence, the present invention is appropriate for deep sub-micron technology in providing semiconductor devices.

Another object of the present invention is to provide a process for forming the shallow trench isolation. The present invention can from a convex remainder after etching the nitride layer by way of using a residual etching process, so as to round the top corner of the trench. Furthermore, this invention can use a thermal process having a low temperature with a short processing time to substitute for a thermal process having a high temperature long processing time during the follow-up process. Therefore, this invention can reduce the complexity of the conventional process and hence, endin cost reduction. Thus, the present invention can correspond to economic effect.

In accordance with the present invention, a new method for forming the semiconductor devices is disclosed. First of all, a semiconductor substrate that has a pad oxide layer thereon is provided. Then a dielectric layer is formed on the pad oxide layer. Afterward, a residual etching process is performed to etch the dielectric layer to form an opening and a convex remainder of the dielectric layer. The convex remainder of the dielectric layer and the semiconductor substrate are then etched by way of using a top rounding process to form the rounding corners on the semiconductor substrate. Subsequently, perform a process for forming the trench in order to form a trench with the rounding corners. Finally, the follow-up processes are performed to form the shallow trench isolation. Because the corners of the shallow trench isolation are rounded by way of using the residual etching process and the top rounding process, the high electric field and the pre-breakdown or the discharge-tipped effect are avoided. It is not necessary that the thermal process with high temperature is used to round the corners, whereby the process can be simplified and hence, cost down.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Preferred embodiments of the present invention will now be described in greater detail. Nevertheless, it should be recognized that the present invention can be practiced in a wide range of other embodiments besides those explicitly described, and the scope of the present invention is expressly not limited except as specified in the accompanying claims.

Figure 1A:
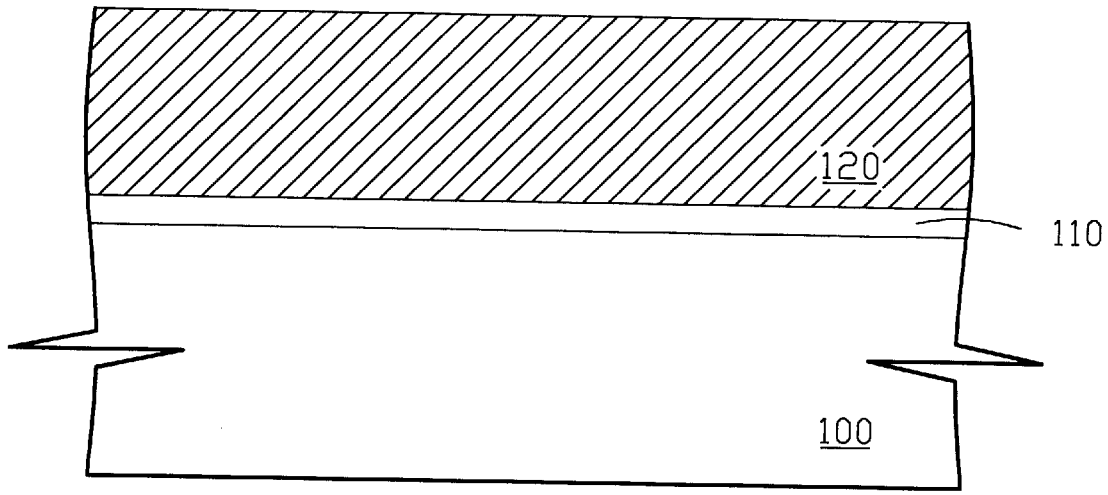
FIG. 1A to FIG. 1D show cross-sectional views illustrative of the shallow trench isolation with the conventional process.
Figure 1B:
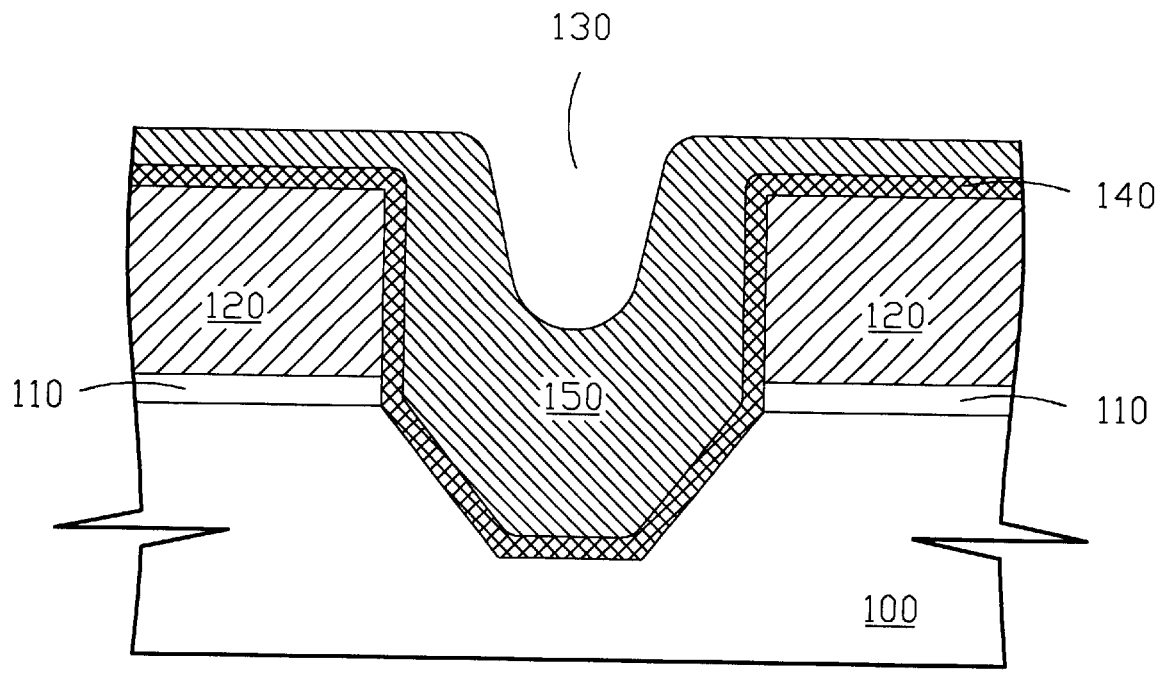
Figure 1C:
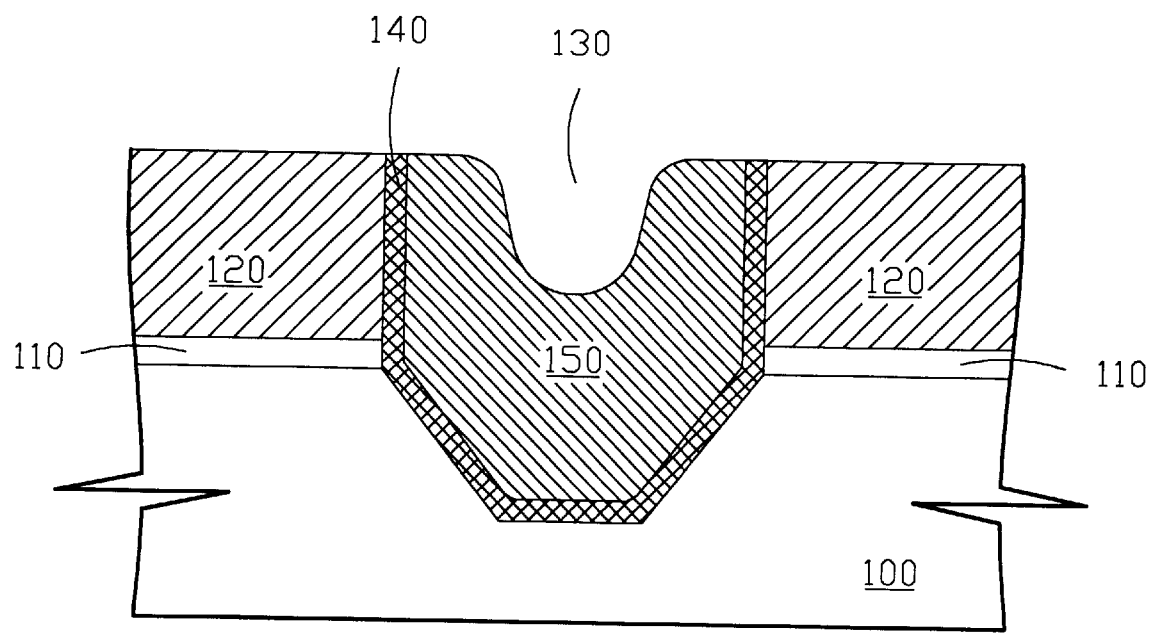
Figure 1D:
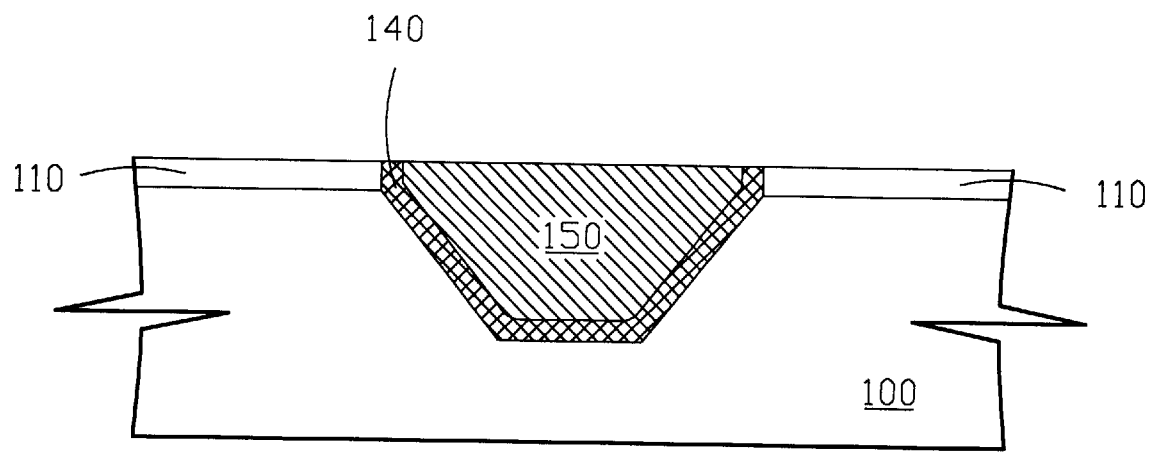
Figure 1E:
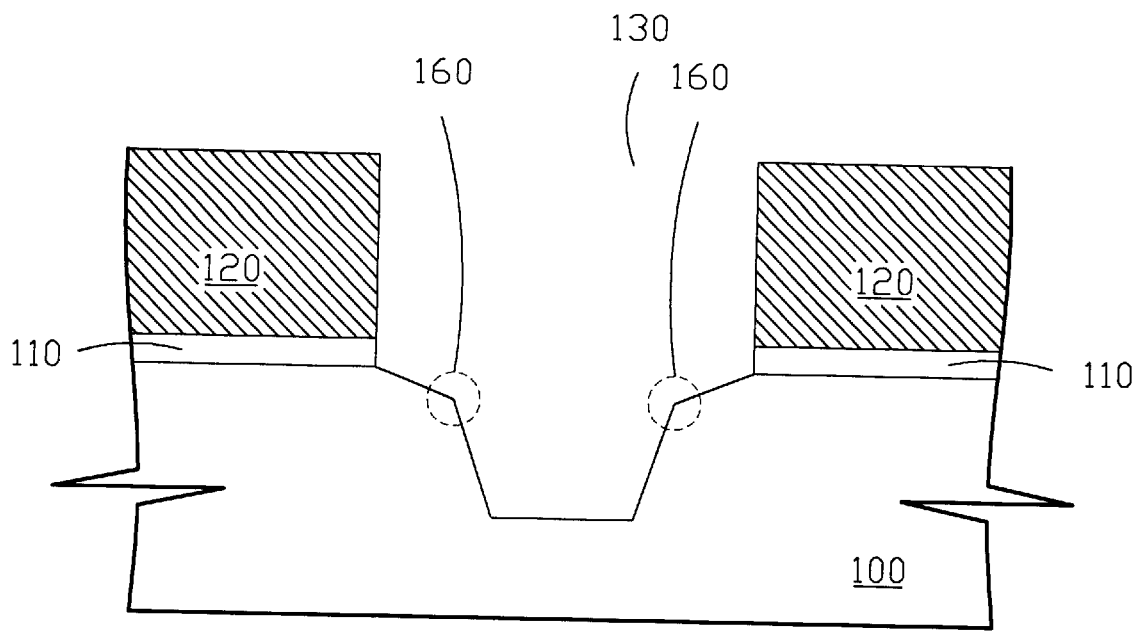
FIG. 1E shows cross-sectional views illustrative of the shallow trench isolation with the conventional etching process.
Figure 2A:
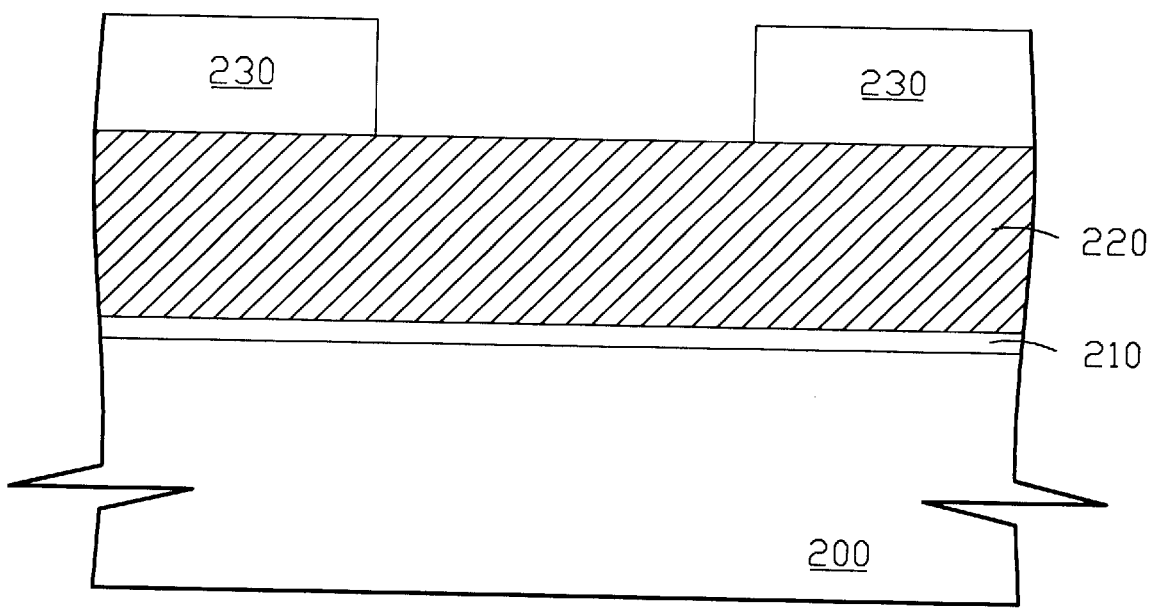
FIG. 2A to FIG. 2D show cross-sectional views illustrative of various stages for forming a shallow trench having a rounded corner by way of using a residual etching process in accordance with the first embodiment of the present invention.
Figure 2B:
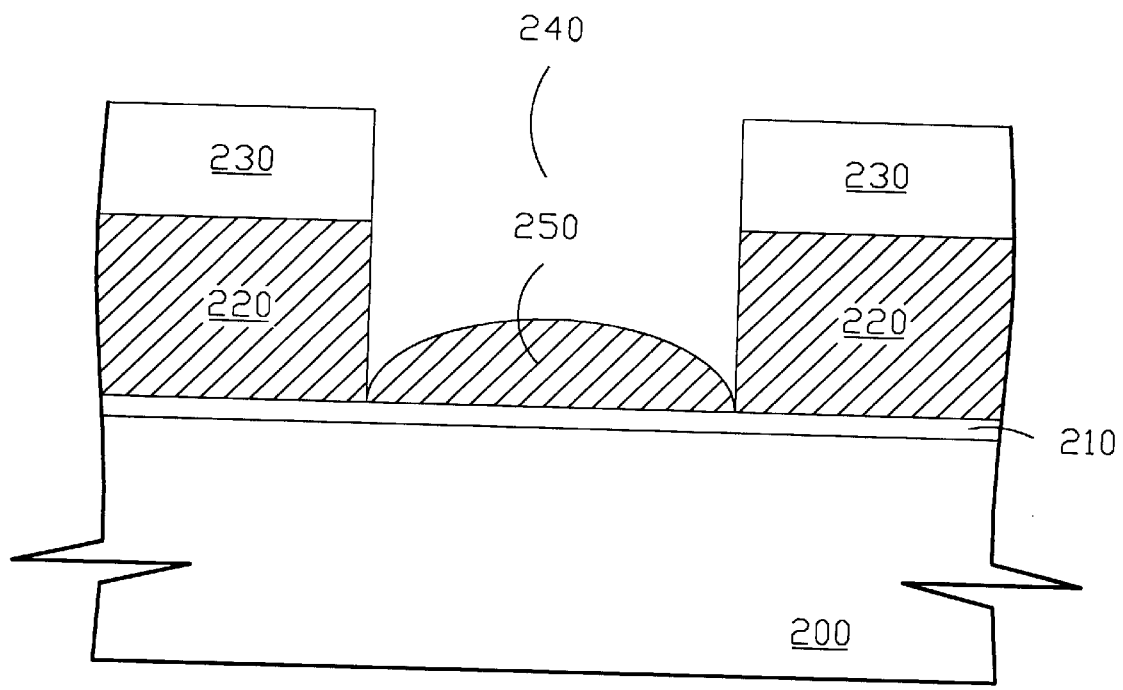

As illustrated in FIG. 2A, in the first embodiment of the present invention, a semiconductor substrate 200, that has a pad layer 210 thereon, is provided. Then a nitride layer 220 is formed on the pad layer 210. Next, a photoresist layer 230 is formed and defined on the nitride layer 220. Afterward, the nitride layer 220 is etched by way of using a residual etching process and the photoresist layer 230 as an etching mask. This is to form an opening 240 in the nitride layer 220 and place a convex remainder 250 on the pad layer 210 of the opening 240, as shown in FIG. 2B. Wherein the residual etching process comprises: an etchant, such as $CF_4/HBr$ that has an etching ratio more than about 2; a total flow that has a range about 90 to 110 sccm; a pressure that has a range about 5 to 15 mT; a top power that has a range about 500 to 750 W; and a bottom power that has a range about 110 to 150 W.

Figure 2C:
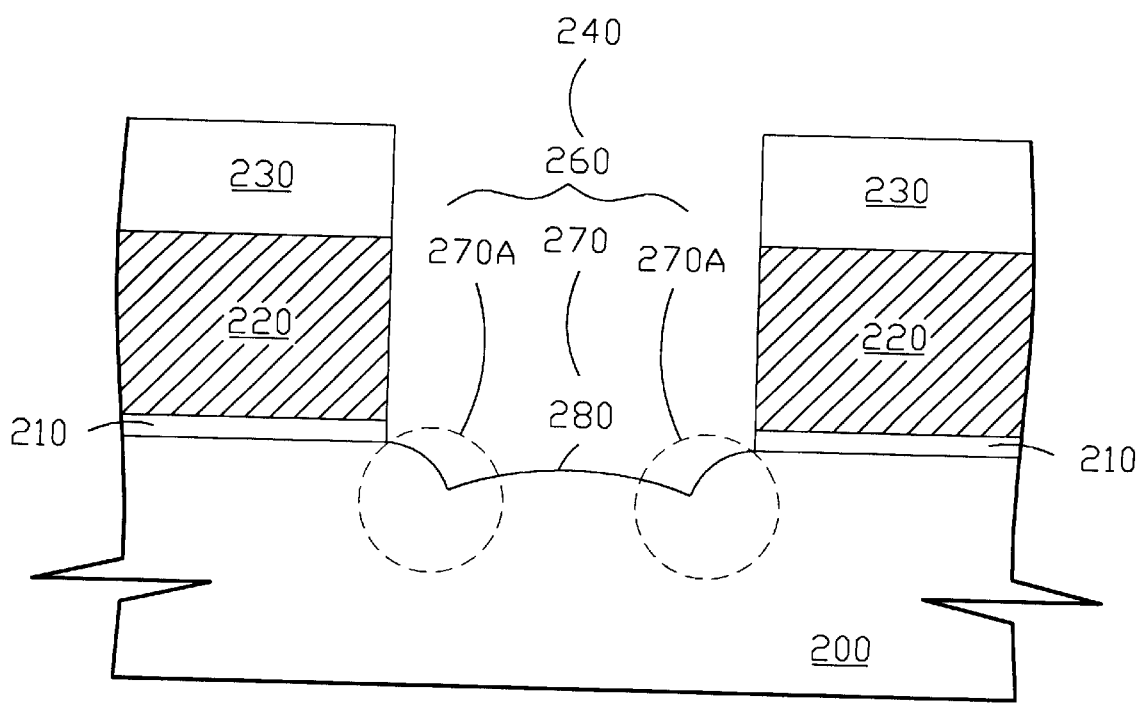
Figure 2D:
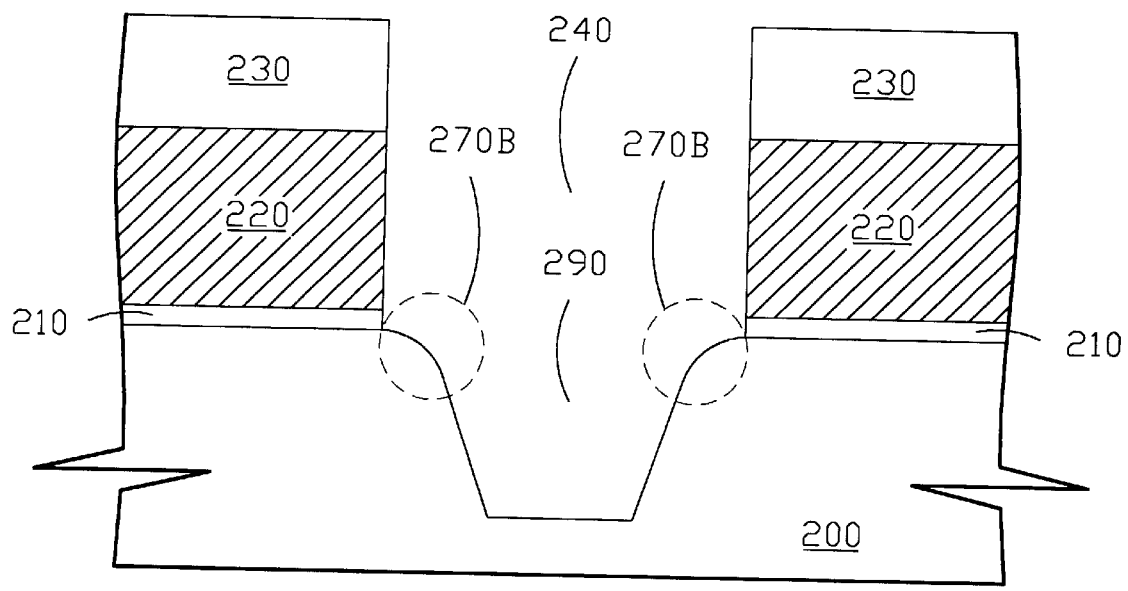

Referring to FIG. 2C, in this embodiment, the convex remainder 250 of the nitride layer 220 and pad layer 210 and semiconductor substrate 200 are then etched by way of using a top rounding process . Then a photoresist layer 230 as an etching mask and the convex remainder 250 as an etching front to form a fillister 260 on the semiconductor substrate 200 of the opening 240. The fillister 260 has the arc sidewalls 270A and arc bottom 280. Wherein the top rounding process comprises: an etchant, such as $HBr/CF_4$ that has an etching ratio more than about 1; a total flow that has a range about 100 to 110 sccm; a pressure that has a range about 20 to 50 mT; a top power that has a range about 500 to 750 W; and a bottom power that has a range about 130 to 150 W. Subsequently, etching the fillister 260 by way of a process for forming the trench in order to form a shallow trench 290 with the rounding corners 270B, as shown in FIG. 2D. Finally, the follow-up processes are performed to form the shallow trench isolation.

Figure 3A:
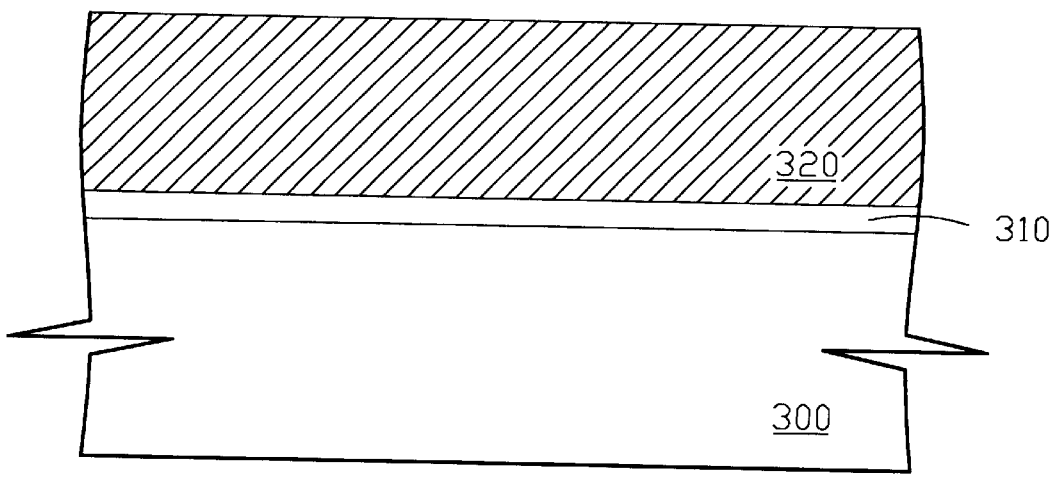
FIG. 3A to FIG. 3G show cross-sectional views illustrative of various stages for forming a shallow trench isolation having a rounded corner in accordance with the second embodiment of the present invention.
Figure 3B:
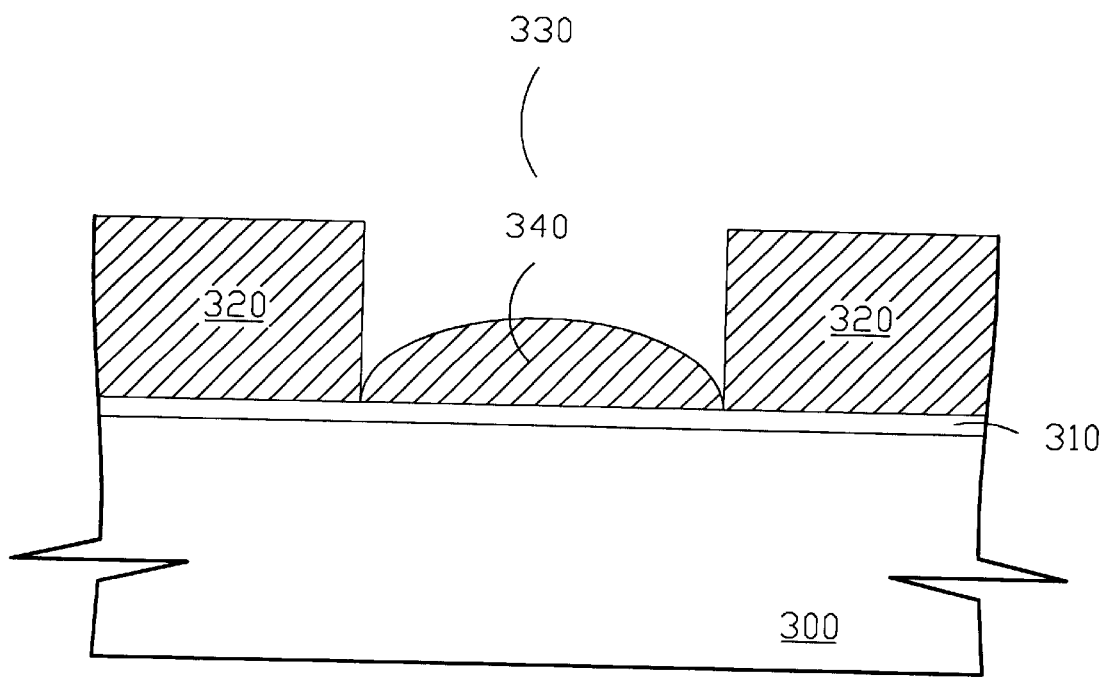
Figure 3C:
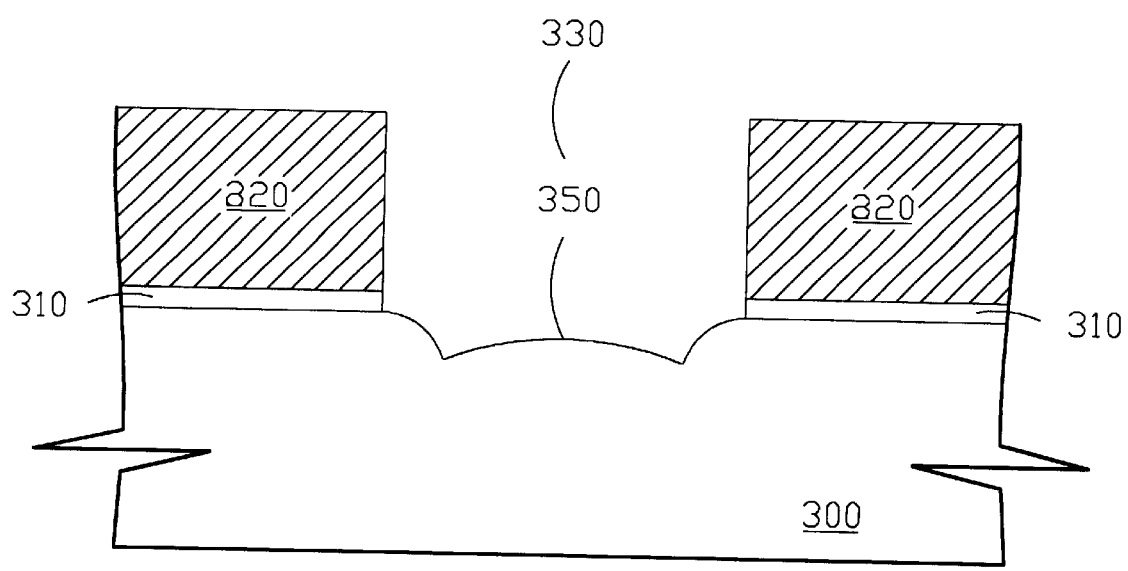
Figure 3D:
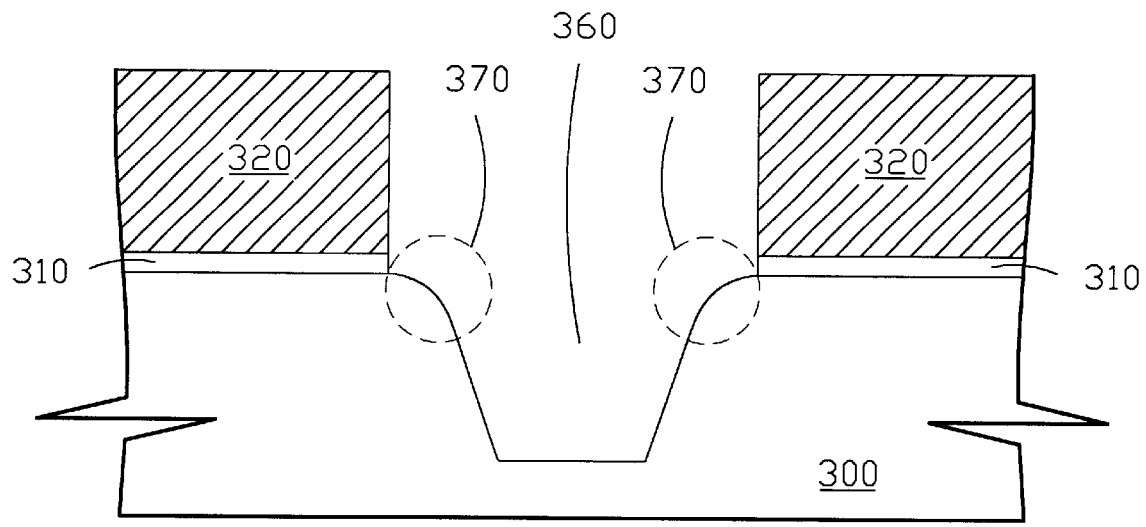

As illustrated in FIG. 3A to FIG. 3C, in the second embodiment of the present invention, a semiconductor substrate 300 is provided, wherein the semiconductor substrate 300 has a pad layer 310, such as an oxide layer, and a dielectric layer 320, such as a nitride layer, thereon. Then performing an opening process to form an opening 330 in the dielectric layer 320. A portion of remainder 340 remains of the dielectric layer 320 on the bottom surface of the opening 330, wherein the opening process comprises of a residual etching process. Then the residual etching process comprises a low polymer gas, such as $CF_4/HBr$. Afterward, by way of a top rounding process to form a convex fillister 350 on the semiconductor substrate 300 of the opening 300 will be performed. This is accomplished by removing the remainder 340 of the dielectric layer 320, a portion of the pad layer 310 and the semiconductor substrate 300. Wherein the top rounding process comprises a middle polymer gas, such as $HBr/CF_4$, or a high polymer gas, such as $CHF_3/CF_4$ or $CH_2F_2/CF_4$. Subsequently, the semiconductor substrate 300 that is located into the convex fillister 350 is removed by way of using a process for forming the trench to form a shallow trench 360 with the rounding corners 370, as shown in FIG. 3D.

Figure 3E:
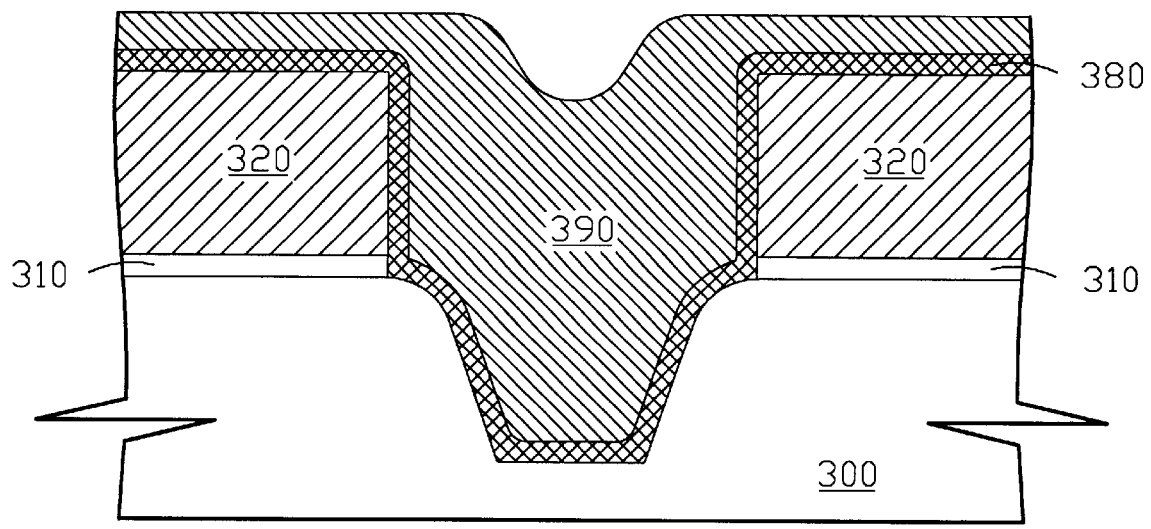
Figure 3F:
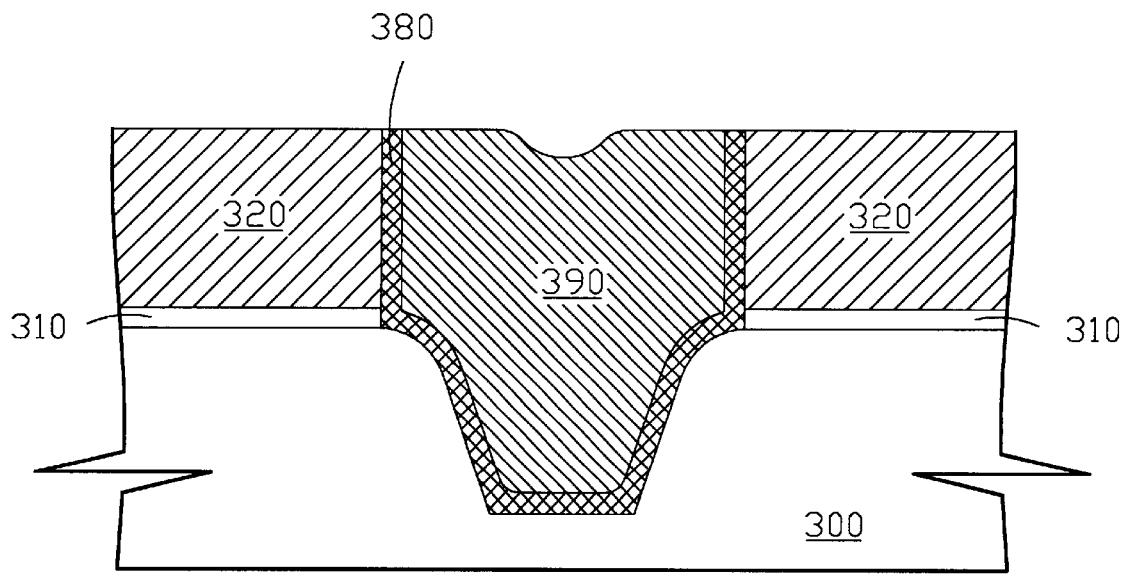
Figure 3G:
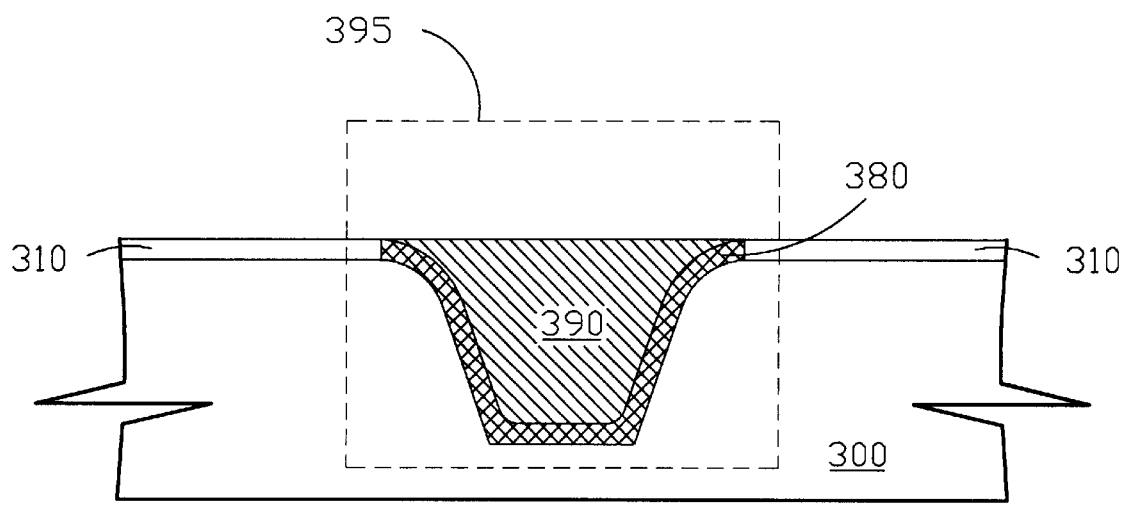

Referring to FIG. 3E and FIG. 3F, in this embodiment, a liner layer 380 is conformed on surfaces of the dielectric layer 320 and the shallow trench 360 mentioned above. An isolation layer 390 is subsequently formed on the liner layer 380. The isolation layer 390 and the liner layer 380 are removed by way of using a removing process, such as a Chemical Mechanical Polishing( CMP )process, till the dielectric layer 320 is exposed. Afterward, removing the dielectric layer 320, the liner layer 380 and the isolation layer 390 until the surface of the pad layer 310 on the semiconductor substrate 300. Finally, the follow-up processes are performed to form the shallow trench isolation 395, as shown in FIG. 3G.

In these embodiments of the present invention, as discussed above; this invention can use a residual etching process with the low polymer gas and a top rounding process with the middle polymer gas. This is to form the shallow trench isolation with better rounding corners when the opening of the nitride layer is formed., This is to avoid forming the corner-stipped on the top of the trench structure that results in the high electric field and the pre-breakdown or the discharge-tipped effect when the dimensions of the devices is scaled down. Hence, the present invention is appropriate for deep sub-micron technology in providing semiconductor devices. The present invention can from a convex remainder after etching the nitride layer by way of using a residual etching process with a low polymer gas, and then perform a top corner process with a high polymer gas to round the top corner of the trench. Furthermore, this invention also can use a thermal process having a low temperature with a short processing time to substitute for the thermal process having a high temperature with a long processing time during the follow-up process. Therefore, this invention can reduce the complexity of the conventional process and hence a cost reduction. Thus, the present invention can correspond to economic effect.

Of course, it is possible to apply the present invention to the shallow trench isolation process, and also to any one-trench process in the semiconductor devices. Also, this invention can be applied to form the convex remainder by the residual etching process concerning the top rounding process used for performing shallow trench isolation process has not been developed at present. The method of the present invention is the best shallow trench isolation compatible process for deep sub-micro process.

Obviously, many modifications and variations of the present invention are possible in light of the above teachings. It is therefore to be understood that within the scope of the appended claims, that the present invention may be practiced other than as specifically described herein.

Although the specific embodiments have been illustrated and described, it will be obvious to those skilled in the art that various modifications may be made without departing from what is intended to be limited solely by the appended claims.

What is claimed is:

1. A method for forming a trench, the method comprising:
   providing a semiconductor substrate;
   forming a pad layer on said semiconductor substrate;

forming a dielectric layer on said pad layer;

forming and defining a photoresist layer on said dielectric layer;

performing a first etching process by way of using said photoresist layer as an etching mask to etch said dielectric layer, so as to form an opening in said dielectric layer and remain a convex remainder of said dielectric layer on said pad layer of said opening;

performing a second etching process by way of using said photoresist layer as said etching mask and said convex remainder as an etching front to etch said convex remainder and said pad layer and said semiconductor substrate, so as to form a fillister on said semiconductor substrate in said opening; and performing a third etching process by way of using said photoresist layer as said etching mask to etch said fillister, so as to form said trench in said semiconductor substrate.

2. The method according to claim 1, wherein said first etching process comprises a residual etching process.

3. The method according to claim 2, wherein said residual etching process comprises an etchant that is a low polymer gas.

4. The method according to claim 3, wherein said middle polymer gas comprises a $CF_4$/HBr.

5. The method according to claim 2, wherein said residual etching process comprises an etching ratio that is more than about 2.

6. The method according to claim 2, wherein said residual etching process comprises a total flow about 90 to 110 sccm.

7. The method according to claim 2, wherein said residual etching process comprises a pressure about 5 to 15 mT.

8. The method according to claim 2, wherein said residual etching process comprises a top power about 500 to 750 W.

9. The method according to claim 2, wherein said residual etching process comprises a bottom power about 110 to 150 W.

10. The method according to claim 1, wherein said second etching process comprises a top rounding process.

11. The method according to claim 10, wherein said top rounding process comprises an etchant that is a middle polymer gas.

12. The method according to claim 11, wherein said middle polymer gas comprises a HBr/ $CF_4$.

13. The method according to claim 11, wherein said top rounding process comprises an etching ratio that is more than about 1.

14. The method according to claim 11, wherein said said top rounding process comprises a total flow about 100 to 110 sccm.

15. The method according to claim 11, wherein said residual etching process comprises a pressure about 20 to 50 mT.

16. The method according to claim 11, wherein said residual etching process comprises a top power about 500 to 750 W.

17. The method according to claim 11, wherein said residual etching process comprises a bottom power about 130 to 150 W.

18. The method according to claim 1, wherein the surface of said fillister comprises two arc sidewalls and an arc bottom.

19. A method for forming an opening having an arc surface, the method comprising:

providing said semiconductor substrate that has a pad layer on said semiconductor substrate and a dielectric layer on said pad layer;

performing a residual etching process by way of using a low polymer gas as an etchant to etch said dielectric layer, so as to form an opening in said dielectric layer and remain a convex remainder of said dielectric layer on said pad layer of said opening; and performing a top rounding process by way of using a middle polymer gas as an etchant and said convex remainder as an etching front to etch said convex remainder, said pad layer and said semiconductor substrate, so as to form said opening having the arc surface on said semiconductor substrate.

20. The method according to claim 19, wherein said pad layer comprises an oxide layer.

21. The method according to claim 19, wherein said dielectric layer comprises a nitride layer.

22. The method according to claim 19, wherein said low polymer gas comprises a $CF_4$/HBr.

23. The method according to claim 19, wherein said middle polymer gas comprises an etching ratio that is more than about 2.

24. The method according to claim 19, wherein said residual etching process comprises a total flow about 90 to 110 sccm.

25. The method according to claim 19, wherein said residual etching process comprises a pressure about 5 to 15 mT.

26. The method according to claim 19, wherein said middle polymer gas comprises a $CHF_3$/$CF_4$.

27. The method according to claim 19, wherein said middle polymer gas comprises a $CH_2F_2$/$CF_4$.

28. The method according to claim 19, wherein said top rounding process comprises an etching ratio that is more than about 1.

29. The method according to claim 19, wherein said said top rounding process comprises a total flow about 100 to 110 sccm.

30. The method according to claim 19, wherein said residual etching process comprises a pressure about 20 to 50 mT.

31. A method for forming a shallow trench isolation, the method comprising:

providing a semiconductor substrate that has an oxide layer thereon;

forming a nitride layer on said oxide layer;

performing a residual etching process with a $CF_4$/HBr gas as an etchant to etch said nitride layer, so as to form an opening in said nitride layer and remain a remainder of said nitride layer on said oxide layer of said opening;

performing a top rounding process having an etching ratio more than about 1 by way of said remainder as an etching front to etch said remainder and said oxide layer and said semiconductor substrate, so as to form a fillister that has two arc sidewalls and an arc bottom on said semiconductor substrate;

etching said fillister to form a shallow trench having two rounding corners in said semiconductor substrate; and forming said shallow trench isolation.

32. The method according to claim 31, wherein the etching ratio of said residual etching process is more than about 2.

* * * * *